United States Patent
d'Amario

(10) Patent No.: US 9,682,436 B2
(45) Date of Patent: Jun. 20, 2017

(54) ELECTRIC DISCHARGE MACHINE

(71) Applicant: Agie Charmilles SA, Losone (CH)

(72) Inventor: Rino d'Amario, Sigirino (CH)

(73) Assignee: Agie Charmilles SA (CH)

( * ) Notice: Subject to any disclaimer, the term of this patent is extended or adjusted under 35 U.S.C. 154(b) by 317 days.

(21) Appl. No.: 14/471,109

(22) Filed: Aug. 28, 2014

(65) Prior Publication Data

US 2015/0060412 A1    Mar. 5, 2015

(30) Foreign Application Priority Data

Aug. 29, 2013  (EP) .................................... 13004252

(51) Int. Cl.
*B23H 1/02* (2006.01)
*B23H 11/00* (2006.01)
*H05K 7/20* (2006.01)

(52) U.S. Cl.
CPC ............. *B23H 1/022* (2013.01); *B23H 1/02* (2013.01); *B23H 11/00* (2013.01); *H05K 7/20927* (2013.01)

(58) Field of Classification Search
CPC ............. B23H 1/00; B23H 1/02; B23H 1/022
See application file for complete search history.

(56) References Cited

U.S. PATENT DOCUMENTS

| | | | | |
|---|---|---|---|---|
| 5,166,489 A * | 11/1992 | Huff, Jr. | ................... | B23H 7/04 219/69.12 |
| 5,316,077 A * | 5/1994 | Reichard | ................... | F28F 3/12 165/104.28 |
| 5,420,753 A * | 5/1995 | Akamatsu | ............. | H01L 23/433 165/80.4 |
| 6,080,953 A * | 6/2000 | Banzai | ..................... | B23H 1/02 219/69.12 |
| 7,812,277 B2 | 10/2010 | Buhler et al. | | |
| 7,816,620 B2 | 10/2010 | Buhler et al. | | |
| 7,947,918 B2 | 5/2011 | Buhler et al. | | |
| 8,369,980 B2 * | 2/2013 | Buhler | ..................... | B23H 7/02 219/69.11 |
| 2008/0160246 A1 * | 7/2008 | Buhler | ................ | H01L 23/3735 428/99 |
| 2010/0328893 A1 * | 12/2010 | Higashidani | ....... | H05K 7/20927 361/702 |

FOREIGN PATENT DOCUMENTS

| | | |
|---|---|---|
| CH | 697347 B1 | 8/2008 |
| EP | 1749609 A1 | 2/2007 |
| EP | 1916884 A1 | 4/2008 |
| GB | 966894 A | 8/1964 |
| JP | H04-250920 | 9/1992 |

OTHER PUBLICATIONS

European Search Report dated Feb. 14, 2014, for related European Patent Application No. 13004252.6.

* cited by examiner

*Primary Examiner* — Ryan Reis
(74) *Attorney, Agent, or Firm* — Harness, Dickey & Pierce, P.L.C.

(57) ABSTRACT

The invention relates to a pulse generator module (50) for electric discharge machines which comprises a generator enclosure (51) containing printed circuit boards (PCBs), wherein at least one of the PCBs is a generator board (52). The PCBs (52) are all arranged in one plane.

20 Claims, 3 Drawing Sheets

ELECTRIC DISCHARGE MACHINE

CROSS REFERENCE TO RELATED APPLICATION

This application claims the benefit and priority to European Patent Application No. 13 004 252.6 filed Aug. 29, 2013. The entire disclosure of the above application is incorporated herein by reference.

BACKGROUND OF THE INVENTION

Field of Invention

The present invention refers to an electric discharge machine and to a pulse generator module, in particular to the arrangement of the pulse generator module in such an electric discharge machine.

Discussion

An electric discharge machine (EDM) comprises essentially a machine frame, a dielectric conditioning unit, a control unit and a pulse generator. According to the current practice, the pulse generator is located in a cabinet, generally with the control unit and motor control boards, power supplies, etc. Said cabinet is generally located behind or at the side of the machine frame. The pulse generator boards and the other boards are arranged in racks guided in rails, with the printed circuit boards (PCB's) parallel to each other, side by side. In this way the generator is easily accessible during the assembly and cabling but also to service personnel and the boards can be replaced in case of necessity. Generator boards are connected with a power supply and are communicating with other boards in the same cabinet. Special shielded generator cables are used to feed the pulses to the electrodes.

It is well known that stray capacitances and inductances affect pulse shape. In particular short high current pulses with high current gradient (as typically used in WEDM and micro EDM) are flattened, that is current gradient and peak current are reduced and pulse duration is extended. To avoid these negative effects, the entire circuitry and cabling are constituted in consideration thereof.

U.S. Pat. No. 5,166,489 to HUFF discloses the so called gap boxes, which are arranged close to the spark gap in wire electric discharge machines. The gap box is housing the isolation diodes, which represent a portion of the power supplying circuitry that supplies the desired waveform of pulses to the wire electrode. The gap box housing has comparably small dimensions; lower and the upper gap boxes are sometimes arranged respectively in the upper and in the lower wire guiding arm. The lead distance from gap box to current feeder is only in the order of 200 mm. The gap box sometimes comprises a cooling circuit to dissipate the heat produced by the gap box circuitry and to avoid thermal distortion of machine frame and other structural components. The use of these gap boxes have led to great improvement of the quality of the surfaces machined by WEDM.

Japanese Patent Document No. 4-250920A to INOUE discloses generator modules provided under the workpiece mounting base, which are stored in a watertight casing and water-cooled by means of the machining liquid directly via the casing of these generator modules. The current supply to the workpiece side is directly executed from the generator module to the mounting base, without long cables. INOUE provides very high integration, unfortunately the space available under the workpiece mounting base is very limited, and there is practically not enough space to house the generator boards according to current designs. Considering that generator casings and cable couplings must be perfectly watertight but still accessible, it becomes apparent that this solution is not applicable with current technique.

U.S. Pat. No. 6,080,953 to BANZAI discloses a pulse generator module arranged in proximity of the spark gap, wherein processing fluid is used for direct cooling of the heat generating elements. Several variants are displayed; the enclosure of the generator is immersed or exposed to the machining liquid so as to obtain a direct cooling effect by means of the cooling liquid. In this way, separate cooling of the generator module becomes unnecessary. However, with this approach the machining liquid in the processing area is the same as the generator cooling liquid, which is particularly critical during the main cut. The waste heat of the generator module is fed into the work tank, making it even more difficult to keep the temperature of the working fluid at a stable value (prerequisite for having a precise machining of a workpiece). By adapting the BANZAI system, it would be necessary to limit respectively compensate errors due to thermal distortion of workpiece and machine body caused by the additional waste heat produced by the generator module.

Further, EP 1 749 609 to BÜHLER discloses an EDM that comprises a plurality of configurable modules, for instance a machine control module, a drive module and a generator module. These modules are linked to a node to form a data network, so that they can send and receive data from said node. In this way the modules can be located where needed. For instance, said generator module and a process monitoring module are conveniently arranged in the vicinity of the spark gap. Still, the application of this state of the art requires the use of a specific node and requests a sophisticated network systems, which is technically complex.

SUMMARY OF INVENTION

An objective of the present invention is to bring the generator module near to the working area without negatively affecting the working process from a thermal point of view and taking into account the delimiting space available in electric discharge machines.

Thanks to the particular inventive design of a generator module in electric discharge machines, including the physical position and orientation of the generator boards, the design of the generator enclosure, as the cabling and contacting of the electrodes, this objective is achieved. The invention further discloses in preferred embodiments special measures for the evacuation of the heat dissipated on said boards and the thermal insulation of boards and enclosure.

According to the present invention, the generator boards are no longer mounted in a traditional rack, facing and spaced from each other to spatial arrangement in cubical form, but are inventively arranged in one plane, lying next to each other enclosed in a protective generator enclosure. Preferably, the inventive pulse generator module comprises all components operating in real time, namely the generator boards, including the one or more power modules and its drivers, the oscillator circuit which determines the discharge pulse on- and off-time, the discharge detection circuit, and a process monitoring module for the acquisition of process parameters in view of process servo regulation. The entire pulse generator module further comprises according to the invention a protective generator enclosure and cooling means. The generator enclosure of the inventive pulse generator module is now forming an oblong planar assembly, with the boards mounted and aligned in said enclosure.

The inventive pulse generator module is connected with the numerical control of the electric discharge machine and with the related power supplies; both are preferably installed in the remotely arranged cabinet of the machine tool. The pulse generator module is connected with the numerical control by means of a high speed serial bus (Ethernet-based fieldbus system, f.i. EtherCAT). Process parameters such as ignition delay, average pulse voltage, average pulse current, etc., acquired by means of the process monitoring module are transmitted to the numerical control for control of process and control of the axes.

The power supplies also remain advantageously in the remotely arranged cabinet of the machine tool, because their distance from the machining gap does not negatively affect the process performance.

The inventive pulse generator module is mounted adjacent to the working area, on the work tank. Here its generator enclosure and thus the generator boards lay preferably parallel to the back wall of the work tank or parallel to a side wall of the work tank. In a particular embodiment of the invention, one side of the generator enclosure may be formed by the work tank back wall. In case of a WEDM (wire electric discharge machine), the pulse generator enclosure may typically be mounted at the upper side of the work tank back wall, above of the lower wire guiding arm. It may extend over the entire width of the work tank, so that it may accommodate even two or more power modules if needed.

Alternatively, in case of an EDM or WEDM with fixed, i.e. stationary table, the inventive assembly can be mounted to a stationary part of the machine frame, adjacent to the work tank. Here the distance to the electrodes and thus the length of the electrode cables to the current feeders (and consequently to the wire) and to the workpiece support (and thus to the workpiece) is substantially similar. However, as explained further on, to achieve the full benefit of the invention the generator enclosure is preferably supported by the work tank itself.

In the inventive pulse generator module, the main heat dissipating power components of the generator board are preferably clamped on a heat sink. A fluid cooling circuit is preferably mounted on the back wall of the generator enclosure, being pressed against that heat sink. These elements are preferably arranged such as to avoid any contact between the heat sink and the generator enclosure. In this way most of the heat generated by the main dissipating components is easily conveyed into the fluid cooling circuit, and the generator enclosure is effectively protected from becoming a radiator, so that the machine frame and machine tank remain thermally unaffected. The printed circuit board (PCB) itself is preferably located in the vicinity of the back wall of the work tank, contributing to thermally separating the heat dissipating components of the generator from the work tank, respectively from the machining fluid and the workpiece.

In a particularly preferred embodiment, at least one of the generator poles is led through the PCB plate and through the work tank, so as to shorten the distance to the electrodes. Advantageously one of the generator board terminals—the ground pole—is electrically coupled directly to the work tank, so that the machine can operate without any special ground cable in the machining area. An additional improvement is achievable by further shortening the current path from the generator ground pole to the workpiece, for instance by providing a plurality of additional braided cables or band type conductors such as those described in Swiss Patent Document No. CH697347. The same effect is achieved by prolonging the work piece support and by electrically coupling said support directly with the work tank back wall. These additional conductors provide a shortened current path which is of particular relevance for high frequencies.

In a preferred embodiment of the invention, the generator enclosure, the work tank, the workpiece support and the intermediate elements are made of electrically conductive material. In this way, said one generator ground pole is easily connected to the workpiece; a separate cabling from generator ground to the workpiece pole becomes therewith unnecessary, or may be realized in a very simple form.

The second generator terminal—the "hot" pole—is led through the work tank back wall by means of an insulated passageway by prolonging the generator board terminals, so that the terminals are presented inside of the work tank. The insulated passageway for the electrode cables in the back wall is preferably located above the max water level so as to avoid any possible trouble due to water infiltration. From said hot terminals the second generator pole is linked to the current feeders, which are arranged respectively in the upper and the lower guiding head by means of a plurality of comparably short electrode cables. By this constitution the pulse shape remains nearly optimal, and thus provides improved machining results. Thanks to the inventive design, the cabling in the machining area becomes simpler and more effective, resulting in economic savings.

Since the inventive pulse generator module is so close to the spark gap, the special coaxial generator cables and gap boxes are no longer necessary to preserve the pulse shape. A simple braided cable or equivalent can be used to connect the pulse generator module with the poles. Besides the technical improvement given by the proximity to the spark gap, the invention leads to an improvement in the machining results, there is also a simplification of the required components and thus a substantial reduction of the manufacturing costs.

Also the electromagnetic emissions will be reduced considerably by the reduced distance between pulse generator and workpiece; oscillations due to parasitic capacitances of electrode cable are largely avoided thanks to the inventive design.

The generator enclosure for the inventive pulse generator module provides protection against dust and splashes from the working area. The enclosure preferably comprises the already mentioned cooling fluid circuit to evacuate the dissipated heat. For instance, the cooling fluid circuit may be a pipe with dielectric fluid fed from the dielectric unit to the generator enclosure, where the fluid circulates through one or more heat sink elements, or along the generator enclosure, then circulates back to the dielectric unit, for instance to a heat exchanger. In this way most of the heat dissipated in the generator boards of the inventive pulse generator module is caught at its origin and is evacuated effectively. More preferably a fluid cooling is supported by a forced internal air circulation in closed circuit, so that the temperature within the generator enclosure is leveled. Said internal air circulation helps to protect the generator module against defects and damages due to condensation. The generator module may comprise temperature and/or humidity sensors to monitor the ambient in the generator enclosure, and sensors to monitor the cooling fluid circuit.

The generator module comprises at least a partial if not entirely a thermal insulation. The generator enclosure and the work tank are advantageously thermally insulated one against the other. As mentioned above, the inventive pulse generator module is mounted adjacent to the work tank. The PCB's are preferably mounted with their PCB plates positioned in vicinity and parallel to the work tank back wall, while the components mounted on the PCB including the heat sources remain allocated on the other side, i.e. further away from the work tank back wall. In this way the PCB plates contribute to thermally separate the heat dissipating components of the generator from the work tank and in that way from the machining fluid and the workpiece.

The thermal insulation may be constituted by at least one air layer resulting between an imaginary wall formed by the PCB plates and the work tank back wall or generator enclosure. Said imaginary wall may be completed by a plurality of deflectors and sealing or insulation panels, so as to improve the thermal insulation.

The additional thermal shielding by means of insulation panels may be limited to the areas of the main heat sources and/or where sensitive parts of the machine frame or work tank are exposed to thermal irradiation, respectively to convection flow. In this way the workpiece, the working fluid and the machine frame are effectively protected from the heat dissipated in the generator enclosure.

In the following, the invention will be explained in more detail by the use of figures. It is herewith explicitly reminded, that the invention is not limited to the embodiments illustrated in these figures. The figures show:

DETAILED DESCRIPTION OF THE PREFERRED EMBODIMENTS

Figure 1:
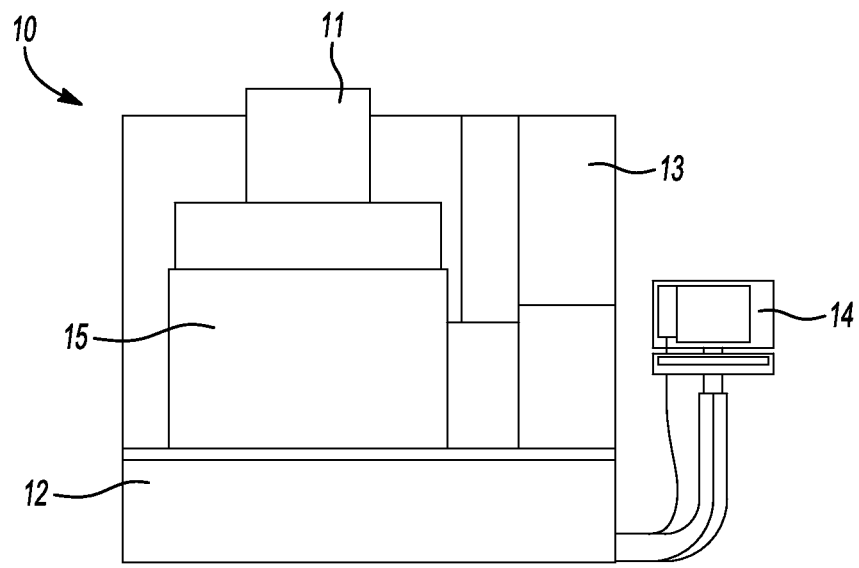
FIG. 1 shows a front view of a wire electric discharge machine (WEDM).

FIG. 1 shows the main elements of a wire electric discharge machine (WEDM) 10, that is a machine frame 11, a work tank 15, a dielectric conditioning unit 12, an electric cabinet 13, a control unit with one or more communication devices 14, generally comprising a human machine interface (HMI), and further components and devices which are not detailed here.

Figure 2:
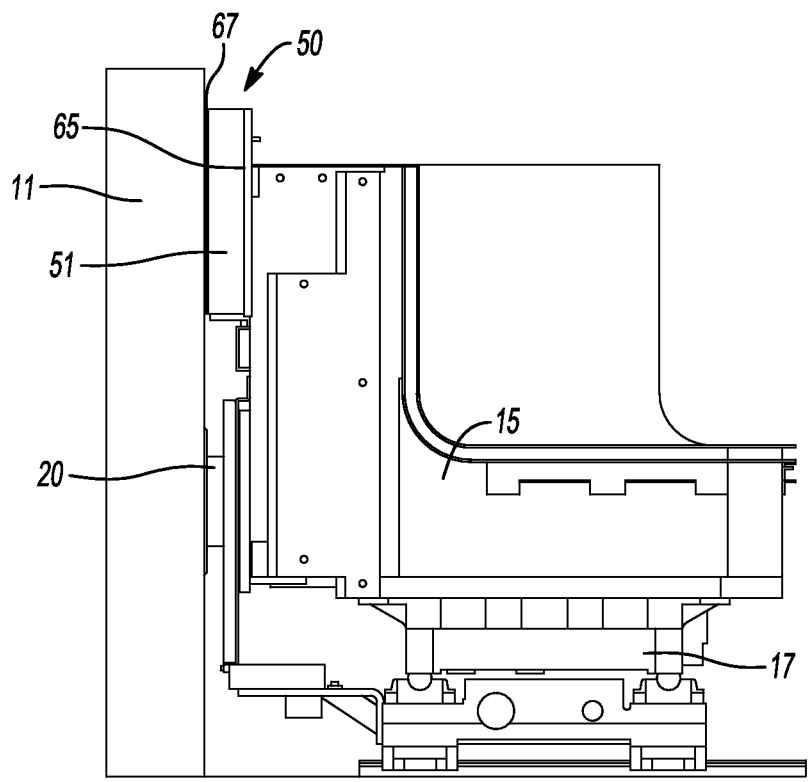
FIG. 2 shows a partial lateral view on the work tank.

The embodiment displayed in FIG. 2 is a partial side view of an automatic work tank 15 in a lowered position. An upper guiding head is not shown for simplicity. The embodiment displayed shows a generator enclosure 51 according to the invention, which is mounted behind the work tank 15, thermally separated thereof by means of an intermediate insulation panel 65. The generator enclosure 51 of the inventive pulse generator module is mounted at the upper side of the work tank back wall, well above of the lower wire guiding arm 20, and extending partially above the upper edge of the work tank. With most applications the water level in the work tank remains below the lower edge of the generator enclosure 51.

Also, the generator enclosure 51 is separated from the machine frame 11 by an air gap 67 or by another insulation panel or insulation means. The generator enclosure 51 of the inventive generator module 50 constitutes preferably a completely closed, oblong container. The cables (not shown) are led from a distant cabinet 13 (not shown) to the generator module 50, and into the generator enclosure 51 by means of cable glands. In the same way a cooling circuit input and output traverses. The inventive generator enclosure 51 further comprises cooling connection inlets and exits (not shown). The generator enclosure 51 comprises most preferably also a window (not shown) by which a number of diagnostic LED's are visible.

Figure 3:
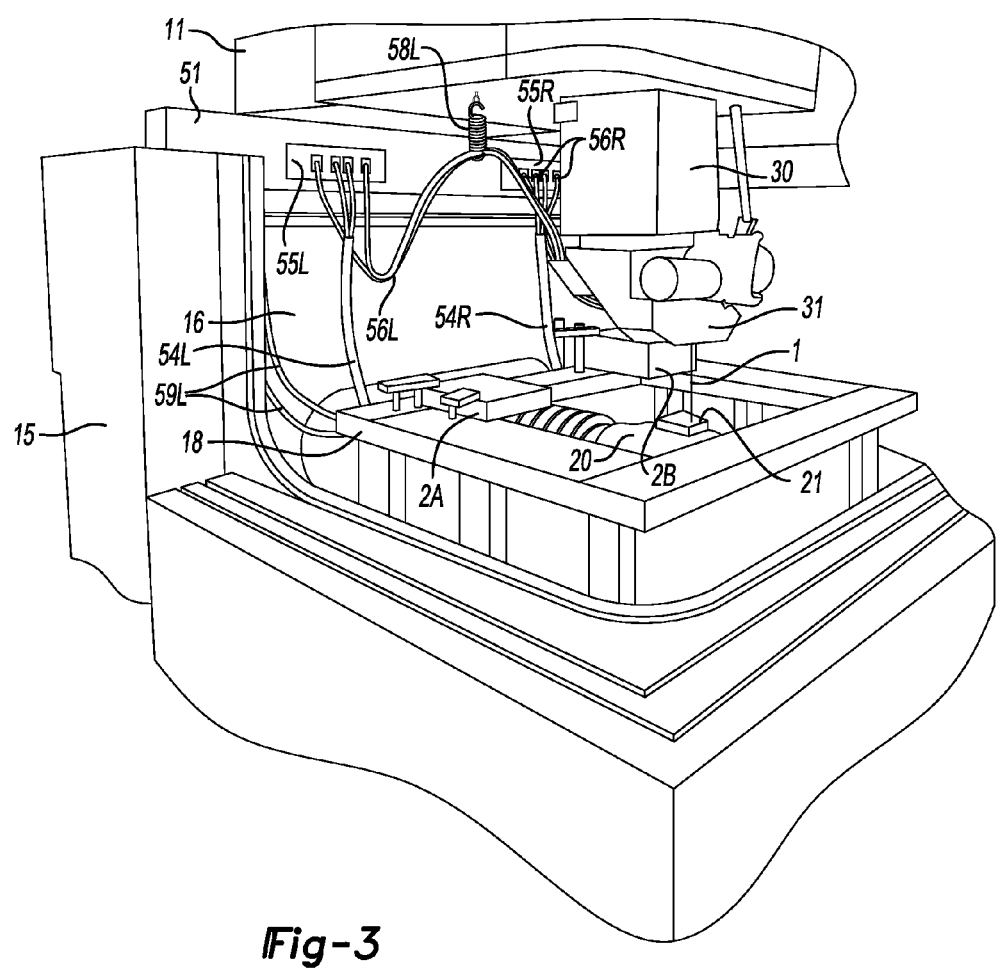
FIG. 3 shows a view on the work tank and machining area.

FIG. 3 shows the automatic work tank 15 of a WEDM including a generator module and its generator enclosure 51 designed according to the invention. The work tank is in its lowered position, providing insight into the working area. Two workpieces 2A, 2B are clamped on the workpiece support 18. The wire electrode 1 is tensioned between an upper guiding head 21 and a lower wire guiding head 31. The wire guiding heads are respectively mounted to the end of an upper 30 and a lower wire guiding arm 20, which in turn are directly or indirectly mounted on a machine frame 11, in known manner. The automatic work tank 15 comprises a back wall 16 with a sealed passage for the lower wire guiding arm 20.

FIG. 3 further displays the enclosure 51 of the inventive generator module 50, mounted at the upper side of the work tank back wall 16. The generator module 50 comprises a left 55L and a right insulated passageway 55R. Each insulated passageway comprises 4 terminals, by which the "hot pole" is brought into the work tank. Two pairs of electrode cables 54L and 56L lead from the terminals on the left insulated passageway 55L. Cable pair 56L leads to the left side of the upper wire guiding head 31 and cable pair 54L leads to the left side of the lower wire guiding head 21. Regarding the right insulated passageway 55R, cable pair 54R leads to the lower wire guiding head 21 and cable pair 56R leads to the upper wire guiding head 31. The cable pairs 54L, 54R, 56L and 56R are respectively coupled to current feeders (not shown) of the upper and lower wire guiding heads 21,31. The two pairs of electrode cables 56L and 56R leading to the upper wire guiding head 31 are supported by support springs, one of which is illustrated as support spring 58L, so that these electrode cables are maintained in a safe position. The second pairs of electrode cables 54L and 54R leading to lower wire guiding head 21 may include an additional "jacket", since those cables are generally submerged and subject to encrustation by machining particles.

The ground on generator board is electrically coupled to the generator enclosure 51, work tank back wall 16, work tank 14, workpiece support 18, machine frame 11 and work pieces 2A, 2B. All these parts represent the ground level; they are made of conductive material and electrically linked with each other. Collectively they have an important mass. Opposite hereto the "hot pole" (or live pole) is made to have the smallest possible mass.

Further, the generator enclosure 51 is electrically linked with the workpiece support 18 by means of a plurality of cables in very simple manner.

The entire current supply in the work tank 15 is symmetrical: the generator boards, the insulated passageways with current terminals and the electrode cables are symmetrically arranged in the machining area. Thus, the above description of the left side of the working area applies also to the right side thereof.

Figure 4:
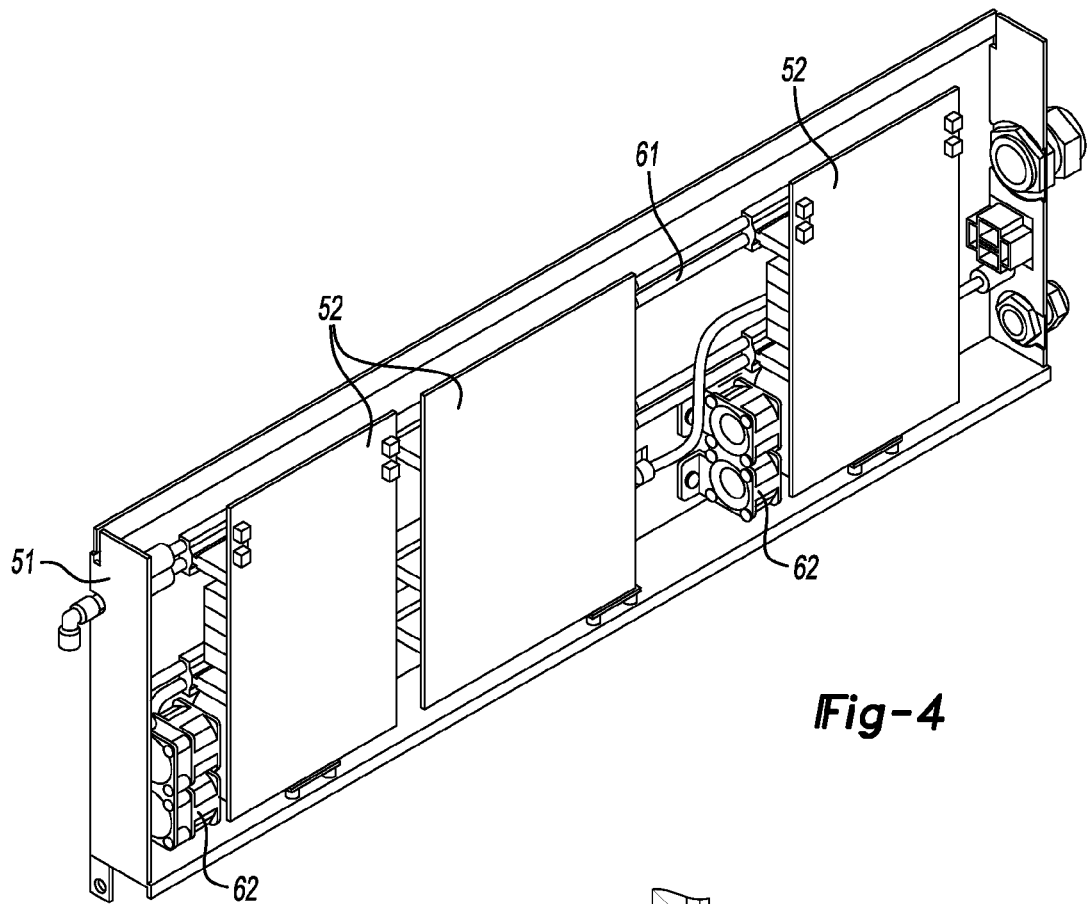
FIG. 4 shows a partial representation of the pulse generator module.

FIG. 4 shows the inventive arrangement of the generator boards in the generator enclosure 51 of the new generator module 50. The boards 52 are inventively arranged in one plane, lying next to each other in a row, basically forming one or more lines. The generator enclosure 51 is in that way forming an oblong and flat, i.e. planar assembly. The inventive assembly is comparably thin, so that it can be easily mounted on the back wall 16 of an EDM work tank without wasting space. The ground pole can be simply and easily coupled with the work tank and thus with the machine ground level. The generator enclosure 51 of the inventive pulse generator assembly further comprises one or more insulated passageways 55 in correspondence of the generator boards inside the enclosure, so that the hot poles are directly brought in the work tank and short electrode cables can be used.

Figure 5:
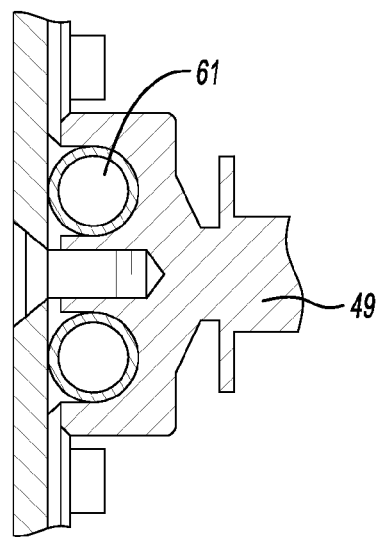
FIG. 5 shows a detail of the pulse generator module.

In a preferred embodiment of the invention, the generator enclosure 51 comprises a fluid cooling circuit 61, which is thermally coupled with the one or more heat sink elements 49 of the generator boards 52, as shown in more detail in FIG. 5. Most preferably, there are for instance four small ventilators 62 providing an internal air circulation. The heat sink elements 49 contribute to convey the air flow in the desired way; a plurality of deflectors (not shown) is provided to optimize the air flow inside the generator enclosure 51.

The invention adopts a compromise between proximity to gap and technical effort. Of course it would be even more desirable to fit the generator in the machining area, as suggested by JP 4-250920A of INOUE, but in adopting such a solution there would be a number of disadvantages to be considered:

First, the size of the generator boards do currently not permit such integration; only a partial integration might currently be possible;

Second, the generator casing and the cabling must be designed as to be watertight and still accessible for service works; such design would be very expensive and risky from the technical point of view, so not economical; and Third, the heat generated by the generator boards is transmitted to the machining liquid, to the workpiece mounting and to other parts of the EDM in close vicinity to the workpiece; this would cause accuracy problems due to thermal expansion; The INOUE solution as BANZAI seem therefore unfavorable, even under an ecological point of view.

The present invention is primarily intended for the use in a WEDM, however it may also apply to other EDM processes where short pulses and quality of pulse transmission is of great relevance.

The inventive pulse generator module for an electric discharge machine is contained in a generator enclosure, which comprises at least two PCBs, whereas at least one of the comprised PCBs is a generator board. The invention is wherein the comprised at least two PCBs are arranged in one plane.

Preferably, the inventive pulse generator module is thermally insulated to avoid heat dissipation from the pulse generator module to the electric discharge machine. For that, at least the part of the surface of the generator enclosure intended to be arranged at an electric discharge machine is insulated. The insulation function can be achieved in different ways (e.g. with thermal shields, thermal barriers respective insulation layers made of suitable materials, heat sink elements or hear removal devices, cooling systems etc.).

In a preferred embodiment, the PCBs arranged in one plane are at least two or more generator boards. The ground pole of the generator boards can be electrically coupled directly to the work tank. In a variant, the hot pole of the generator boards is let through the work tank by means of an insulated passageway.

In a further preferred embodiment, the generator enclosure comprises a fluid cooling circuit which is thermally coupled with one or more heat sink elements of the generator boards; preferably the pulse generator module is also equipped with one or more ventilators for air circulation.

The inventive pulse generator module is preferably designed in such a way that its generator enclosure comprises all generator components necessary for operating the pulse generator module in real time. Preferably, the generator enclosure also comprises a driver circuit for the pulse generator.

The generator enclosure comprises preferably at the least: a generator board, a generator driver circuit, an oscillator circuit, a discharge detection circuit, and a process monitoring module. Most preferably, the generator enclosure has a flat, oblong respectively rectangular form. The depth of the generator enclosure is low (preferably lower than 120 mm, e.g. between 40 and 80 mm, e.g. 60 mm).

The invention here in matter obviously also relates to entire electric discharge machines, preferably wire electric discharge machines (WEDM), which comprise an inventive pulse generator module according to the preceding description. The generator enclosure of the pulse generator module in electric discharge machines is mounted adjacent and parallel to the work tank, preferably the generator enclosure is supported by the work tank itself. Most preferably, the generator enclosure of the pulse generator module is mounted at the back wall of the work tank of the electric discharge machine. In another embodiment, the generator enclosure of the pulse generator module is mounted to a stationary part of the machine frame.

In an alternative embodiment, the described inventive generator module may be split in two or more modules respectively housings, with the modules respectively housings distributed around the work tank and not only on its back side. For example, two or more housings might be mounted at just one side of the work tank (e.g. for ergonomic reasons at the back wall) or at two or more sides of the work tank (e.g. module housings at the left, back and right work tank walls).

The above specification refers to the preferred modes of execution for the invention, but more or less similar embodiments are possible. The invention is therefore not limited to the embodiments described herein. These examples are more intended as an incentive to the person skilled in the art to implement the inventive concept advantageously.

What is claimed is:

1. A pulse generator module for an electric discharge machine contained in a generator enclosure, comprising:
    at least two printed circuit boards (PCBs), whereas at least one of the PCBs is a generator board, wherein the at least two PCBs are arranged in a common plane extending parallel to a longitudinal axis of the generator enclosure.

2. The pulse generator module of an electric discharge machine according to claim 1,
    wherein at least the part of the surface of the generator enclosure intended to be arranged at an electric discharge machine is thermally insulated to avoid heat dissipation from the pulse generator module to the electric discharge machine.

3. The pulse generator module of an electric discharge machine according to claim 1, wherein the PCBs arranged in one plane are at least two or more generator boards.

4. The pulse generator module of an electric discharge machine according to claim 1, wherein a ground pole of the generator boards is electrically coupled directly to a work tank.

5. The pulse generator module of an electric discharge machine according to claim 1, wherein a hot pole of the generator boards is let through a work tank by means of an insulated passageway.

6. The pulse generator module of an electric discharge machine according to claim 1, wherein the generator enclosure comprises a fluid cooling circuit which is thermally coupled with one or more heat sink elements of the generator boards, preferably the pulse generator module is also equipped with one or more ventilators for air circulation.

7. The pulse generator module of an electric discharge machine according to claim 1, wherein its generator enclosure comprises all generator components necessary for operating the pulse generator module in real time.

8. The pulse generator module of an electric discharge machine according to claim 1, wherein its generator enclosure comprises a driver circuit for the pulse generator.

9. The pulse generator module of an electric discharge machine according to claim 7, wherein its generator enclosure comprises at the least: the generator board, a generator driver circuit, an oscillator circuit, a discharge detection circuit, and a process monitoring module.

10. The pulse generator module of an electric discharge machine according to claim 1, wherein its generator enclosure has a flat, oblong form.

11. An electric discharge machine, preferably wire electric discharge machine, comprising a pulse generator module according to claim 1.

12. An electric discharge machine according to claim 10, wherein the generator enclosure of the pulse generator module is mounted adjacent and parallel to a work tank, preferably the generator enclosure is supported by the work tank itself.

13. An electric discharge machine according to claim 12, wherein the generator enclosure of the pulse generator module is mounted at a back wall of the work tank.

14. An electric discharge machine according to claim 11, wherein the generator enclosure of the pulse generator module is mounted to a stationary part of a machine frame.

15. An electric discharge machine according to claim 11, wherein the generator enclosure of the pulse generator module is subdivided in two or more separate housings mounted around the work tank.

16. A pulse generator module for an electric discharge machine, the pulse generator module comprising:
a generator enclosure; and
at least two printed circuit boards (PCBs) within the generator enclosure arranged along a common plane extending parallel to a longitudinal axis of the generator enclosure, at least one of the PCBs is a generator board.

17. The pulse generator module of claim 16, further comprising a fluid cooling circuit within the generator enclosure that is thermally coupled with a heat sink element of the generator board.

18. The pulse generator module of claim 16, further comprising at least one ventilator for air circulation.

19. The pulse generator module of claim 16, further comprising at least one of the following arranged in the generator enclosure: a generator driver circuit, an oscillator circuit, a discharge detection circuit, and a process monitoring module.

20. The pulse generator module of claim 16, wherein the generator enclosure is mounted to a work tank of the electric discharge machine.

* * * * *